US012575181B2

(12) United States Patent
Song et al.

(10) Patent No.: US 12,575,181 B2
(45) Date of Patent: Mar. 10, 2026

(54) THIN FILM TRANSISTOR, PREPARATION METHOD THEREFOR, AND DISPLAY DEVICE

(71) Applicant: BOE TECHNOLOGY GROUP CO., LTD., Beijing (CN)

(72) Inventors: Youngsuk Song, Beijing (CN); Woobong Lee, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 390 days.

(21) Appl. No.: 18/027,753

(22) PCT Filed: Jun. 24, 2022

(86) PCT No.: PCT/CN2022/101047
§ 371 (c)(1),
(2) Date: Mar. 22, 2023

(87) PCT Pub. No.: WO2023/245604
PCT Pub. Date: Dec. 28, 2023

(65) Prior Publication Data
US 2024/0313006 A1 Sep. 19, 2024

(51) Int. Cl.
*H01L 27/12* (2006.01)
*H10D 86/01* (2025.01)
(Continued)

(52) U.S. Cl.
CPC ........... *H10D 86/60* (2025.01); *H10D 86/021* (2025.01); *H10D 86/421* (2025.01); *H10D 86/451* (2025.01)

(58) Field of Classification Search
CPC ...... H10D 86/60; H10D 86/021; H10D 86/01; H10D 86/421; H10D 86/40; H10D 86/451; H10D 30/01; H10D 30/67; H10D 30/6728; H10D 30/6729; H10D 30/673; H10D 30/6734; H10D 30/6755; H10D 30/6757; H10D 30/6708; H10D 30/6715; (Continued)

(56) References Cited

U.S. PATENT DOCUMENTS 12,261,227 B2 * 3/2025 Wang ........................ G09F 9/30
2014/0131712 A1 5/2014 He
(Continued)

FOREIGN PATENT DOCUMENTS

CN 102437178 A 5/2012
CN 102945807 A 2/2013
(Continued)

*Primary Examiner* — Nikolay K Yushin
(74) *Attorney, Agent, or Firm* — WHDA, LLP

(57) ABSTRACT

A thin film transistor (TFT), a preparation method therefor, and a display device are provided in the present disclosure, which belong to the field of display technology. The TFT includes a first active layer and a gate electrode arranged on a substrate extending along a first direction, the first active layer is an arch structure, the gate electrode is penetrated the arch structure, and an orthographic projection of the first active layer on the substrate covers an orthographic projection of the gate electrode on the substrate. The technical solutions of the present disclosure can improve an on-state current of the TFT and reduce an area of the TFT.

18 Claims, 8 Drawing Sheets

(51) Int. Cl.
    H10D 86/40         (2025.01)
    H10D 86/60         (2025.01)

(58) Field of Classification Search
    CPC .... H10D 64/27; H10D 64/421; H10D 64/111;
               H10D 64/117; H10D 30/021; H10D
            30/501; H10H 20/812; H10H 20/855;
                 H10H 20/0364; H10H 20/01
    See application file for complete search history.

(56)                  References Cited

U.S. PATENT DOCUMENTS

| | | | |
|---|---|---|---|
| 2022/0406945 A1* | 12/2022 | Wang ................. | H10D 30/6729 |
| 2023/0140193 A1* | 5/2023 | Choi ................. | H10K 59/1213 |
| | | | 257/288 |

FOREIGN PATENT DOCUMENTS

| | | |
|---|---|---|
| CN | 106960881 A | 7/2017 |
| CN | 114628527 A | 6/2022 |

* cited by examiner

THIN FILM TRANSISTOR, PREPARATION METHOD THEREFOR, AND DISPLAY DEVICE

CROSS-REFERENCE TO RELATED APPLICATION

The present application is the U.S. national phase of PCT Application No. PCT/CN2022/101047 filed on Jun. 24, 2022, the entire contents of which are hereby incorporated by reference.

TECHNICAL FIELD

The present disclosure relates to the field of display technology, and particularly relates to a thin film transistor (TFT), a preparation method therefor, and a display device.

BACKGROUND

TFT, as a switching component and a driving component, is a very important element in the field of display technology, and is widely used in various display devices.

With the development of display technology, it is necessary to improve an on-state current of TFT to improve performance of a display device. In addition, in order to satisfy a high resolution requirement, it is also necessary to reduce an area of the TFT to improve an aperture ratio of the display device.

SUMMARY

The technical problem to be solved by the present disclosure is to provide a TFT, a preparation method therefor, and a display device, which can improve the on-state current of the TFT and reduce the area of the TFT.

In order to solve the above technical problem, embodiments of the present disclosure provide the following technical solutions:

In one aspect, a TFT is provided, including a first active layer and a gate electrode arranged on a substrate extending along a first direction, the first active layer is an arch structure, the gate electrode is penetrated in the arch structure, and an orthographic projection of the first active layer on the substrate covers an orthographic projection of the gate electrode on the substrate.

In some embodiments, the TFT further includes a first gate insulating layer, the gate electrode is located on the substrate and extends along the first direction;

the first gate insulating layer covers the gate electrode, and the first gate insulating layer includes two first slots;

the first active layer is located on a side of the first gate insulating layer away from the gate electrode, extends along the first direction, and is filled in the two first slots to form two arch side surfaces of the arch structure, the two arch side surfaces surrounding the gate electrode.

In some embodiments, the TFT further includes:

a source electrode and a drain electrode, located on a side of the first active layer away from the substrate, and connected to the first active layer, respectively.

In some embodiments, the TFT further includes:

a second active layer located at a side of the gate electrode away from the first active layer, the second active layer is connected to the two arch side surfaces to form a channel surrounding the gate electrode.

In some embodiments, the first active layer further includes a first connection portion connected to the arch side surfaces, the first connection portion is located outside the arch structure and parallel or substantially parallel to the substrate;

the second active layer includes a second connection portion corresponding to the first connection portion, the second connection portion is located outside the arch structure and parallel or substantially parallel to the substrate, the second connection portion is in direct contact with the corresponding first connection portion, an orthographic projection of the second connection portion on the substrate at least partially covers an orthographic projection of the corresponding first connection portion on the substrate.

In some embodiments, the second connection portion is subjected to a conductive treatment; and/or the first connection portion is subjected to the conductive treatment.

In some embodiments, the TFT further includes:

a second gate insulating layer located between the gate electrode and the second active layer, where the second gate insulating layer includes two second slots, the first slots are in communication with the second slots, and the two arch side surfaces are connected to the second active layer via the second slots.

In some embodiments, the TFT further includes:

a first connection part and/or a second connection part extending from the first active layer; where an extension direction of the first connection part is a second direction, the second direction is parallel or substantially parallel to the substrate and perpendicular to the first direction, and the first active layer is connected to the source electrode via the first connection part; and an extension direction of the second connection part is the second direction, and the first active layer is connected to the drain electrode via the second connection part.

In some embodiments, the TFT further includes:

an interlayer insulating layer located between the first active layer and the source electrode and drain electrode, where the first active layer is connected to the source electrode through a first via hole penetrating the interlayer insulating layer, and is connected to the drain electrode through a second via hole penetrating the interlayer insulating layer.

A display device is further provided by the embodiments of the present disclosure, including the TFT as described above.

In some embodiments, the gate electrode is of an integral structure with a gate line of the display device.

In some embodiments, an orthographic projection of the first via hole on the substrate falls within an orthographic projection of the gate line on the substrate; and/or an orthographic projection of the second via hole on the substrate falls within an orthographic projection of the gate line on the substrate.

A preparation method for a TFT is further provided by the embodiments of the present disclosure, including:

forming a first active layer and a gate electrode extending along a first direction on a substrate, the first active layer is an arch structure, the gate electrode is penetrated in the arch structure, and an orthographic projection of the first active layer on the substrate covers an orthographic projection of the gate electrode on the substrate.

In some embodiments, the preparation method further includes:

forming a first gate insulating layer covering the gate electrode, where the first gate insulating layer includes two first slots;

the first active layer is located on a side of the first gate insulating layer away from the gate electrode, extends along the first direction, and is filled in the two first slots to form two arch side surfaces of the arch structure, the two arch side surfaces surrounding the gate electrode.

In some embodiments, the preparation method further includes:

forming a second active layer on a side of the gate electrode away from the first active layer, the second active layer is connected to the two arch side surfaces to form a channel surrounding the gate electrode.

The embodiments of the present disclosure have the following beneficial effects.

In the above-mentioned solutions, a channel width of the TFT can be increased and a width-length ratio of the TFT channel can be increased by a structure of the three-dimensional channel surrounding the gate electrode, thereby increasing an on-state capability of the TFT; at the same time, control of a channel conduction capability of the gate electrode is strengthened by the structure of the three-dimensional channel surrounding the gate electrode, thereby effectively improving a driving capability and working stability of the TFT; in addition, the structure of the three-dimensional channel surrounding the gate electrode effectively reduces the area of the TFT, which is advantageous in improving an aperture ratio of the display device, satisfies the requirement of high resolution, and effectively solves a problem that an existing structure is difficult to improve the resolution by reducing the area of the TFT.

Of course, it is not necessary for any of products or methods of the present disclosure to be practiced while achieving all of the advantages described above. Additional features and advantages of the disclosure will be set forth in the description which follows, and in part will be apparent from the description, or may be learned by practice of the disclosure. The objectives and other advantages of the disclosed embodiments may be realized and attained by the structure particularly pointed out in the written description and claims hereof as well as the appended drawings.

BRIEF DESCRIPTION OF THE DRAWINGS

The accompanying drawings, which are comprised to provide a further understanding of the disclosure and are incorporated in and constitute a part of this specification, illustrate embodiments of the disclosure and together with the description serve to explain the principles of the disclosure and not to limit the disclosure. The shapes and sizes of the components in the drawings do not reflect true proportions, and are intended only to schematically illustrate the present disclosure.

4

Figure 14:
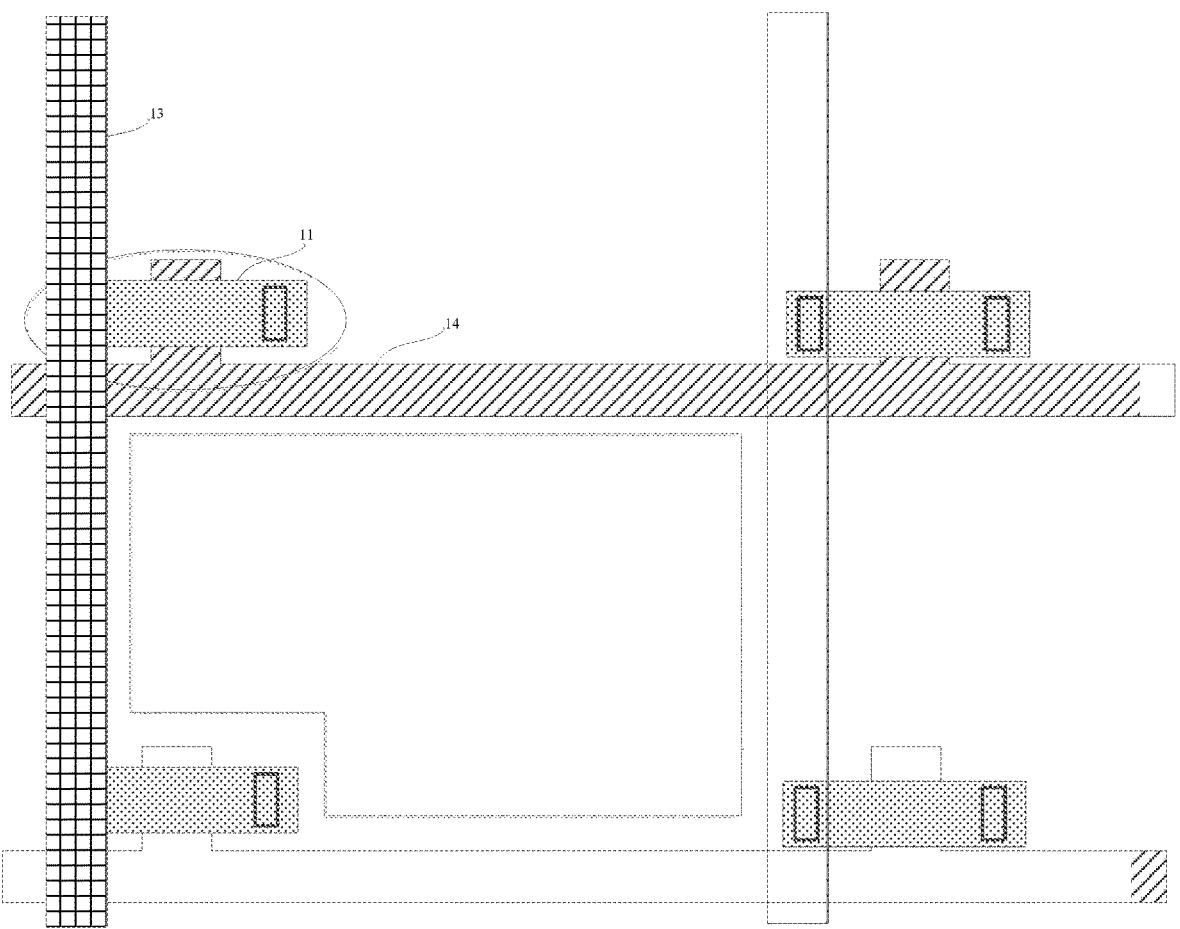
Figure 15:
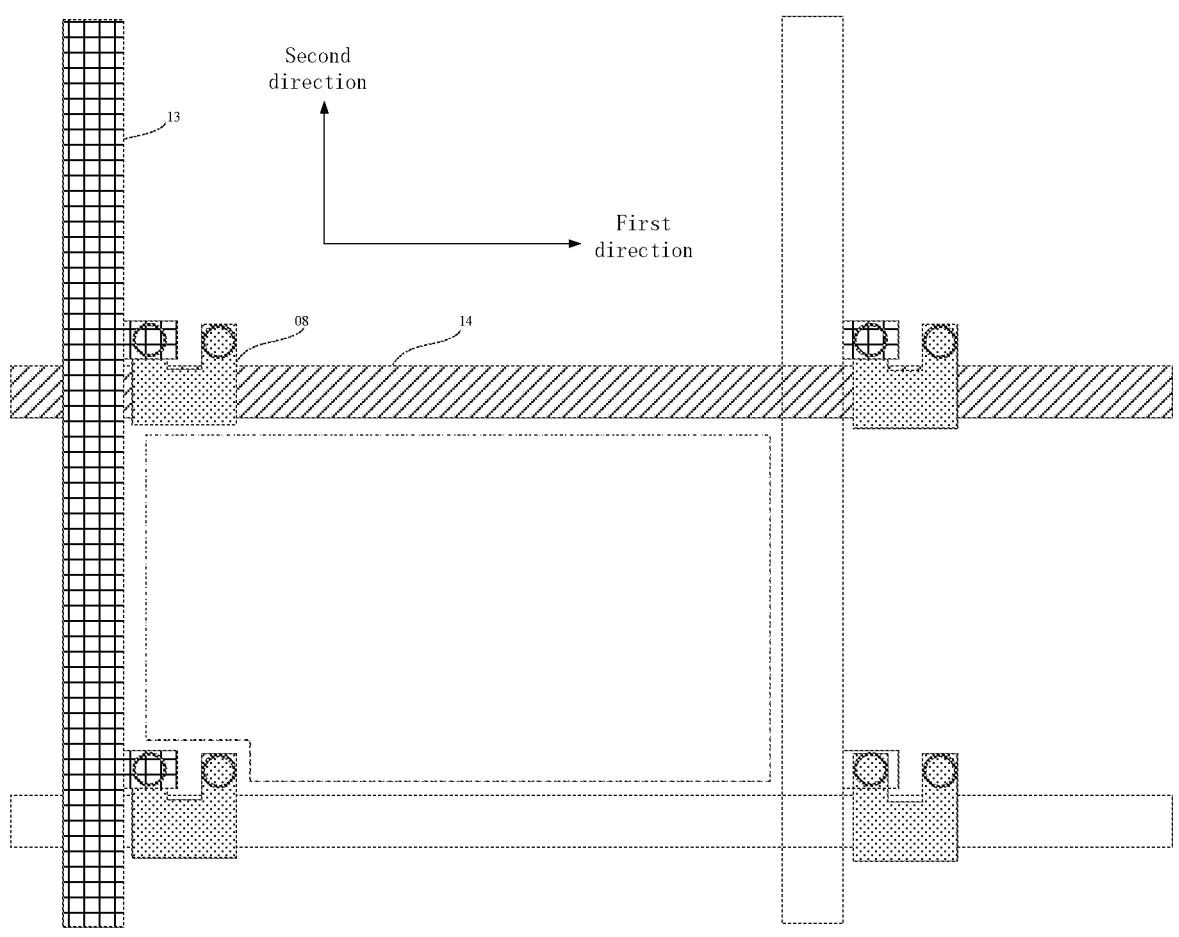
Figure 16:
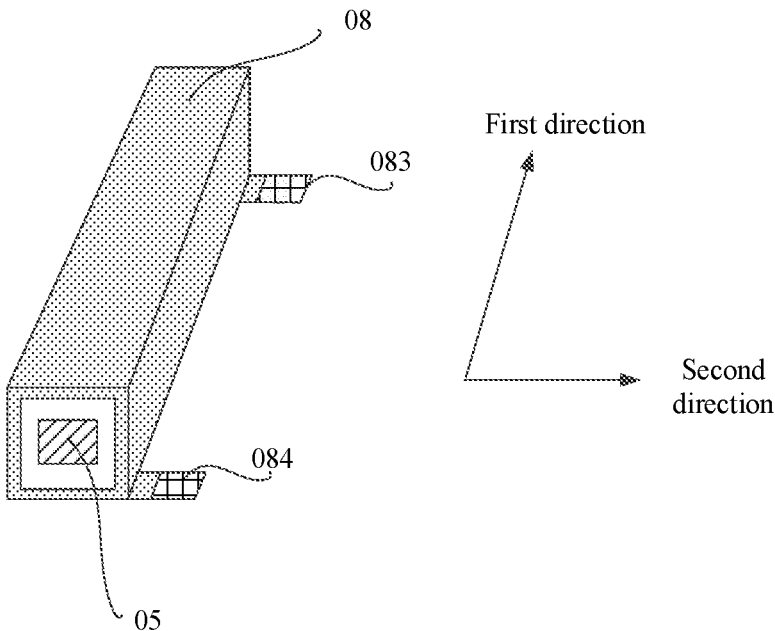
Figure 17:
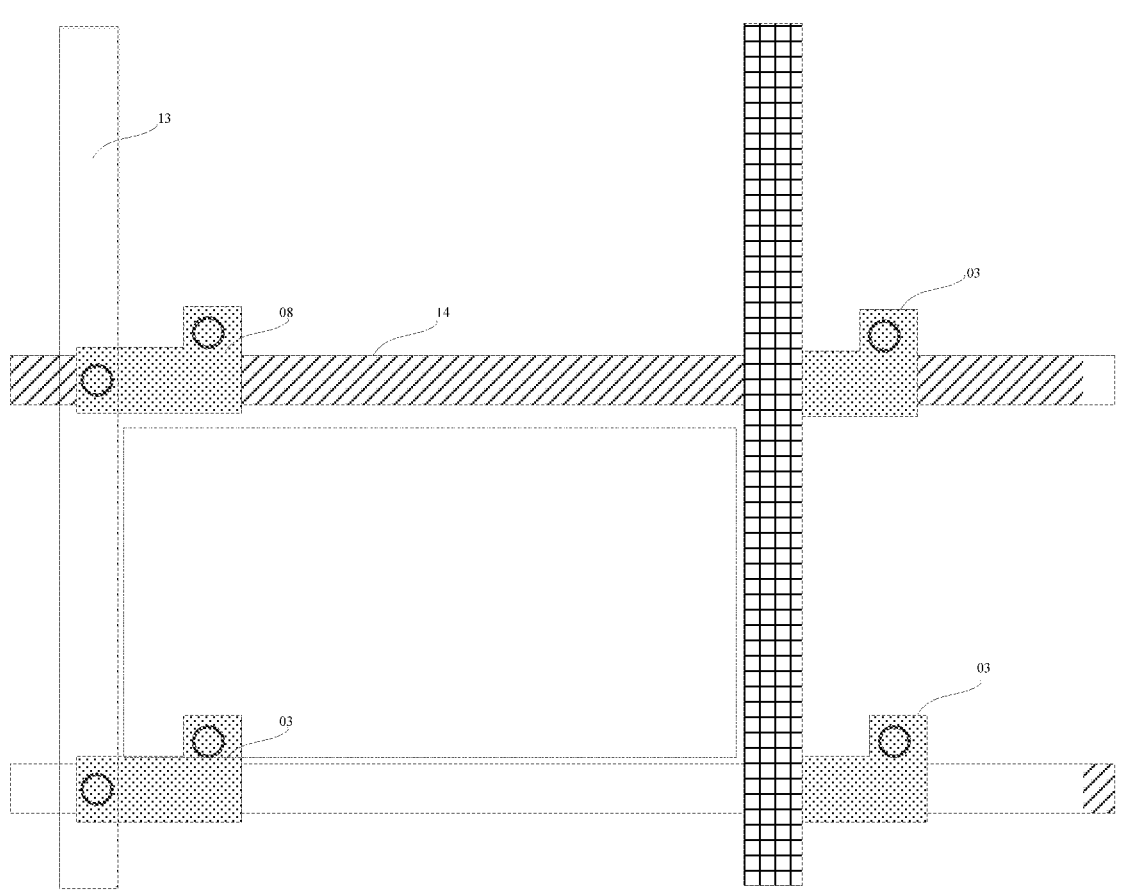
Figure 18:
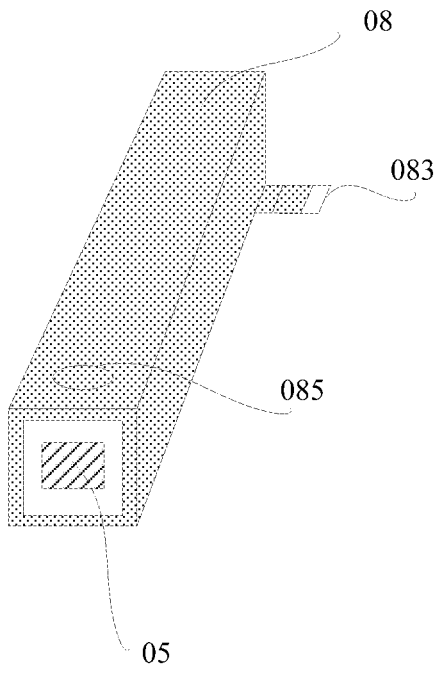
Figure 19:
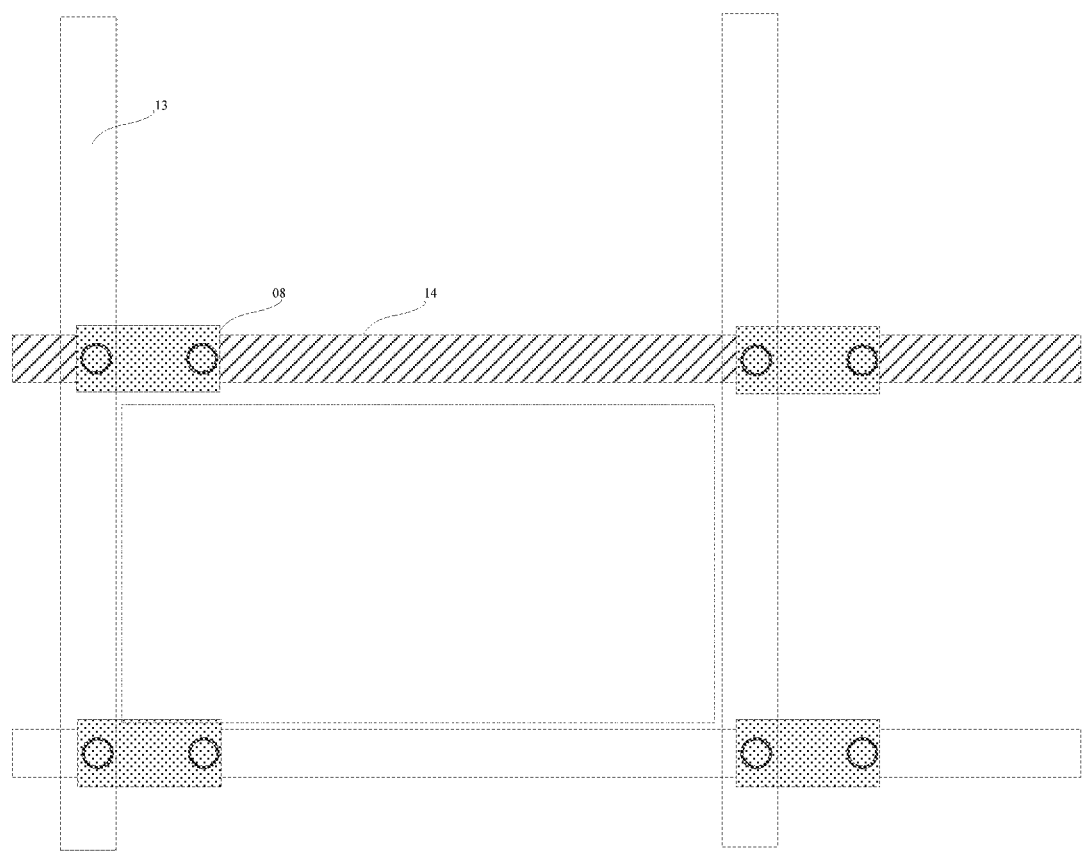
Figure 20:
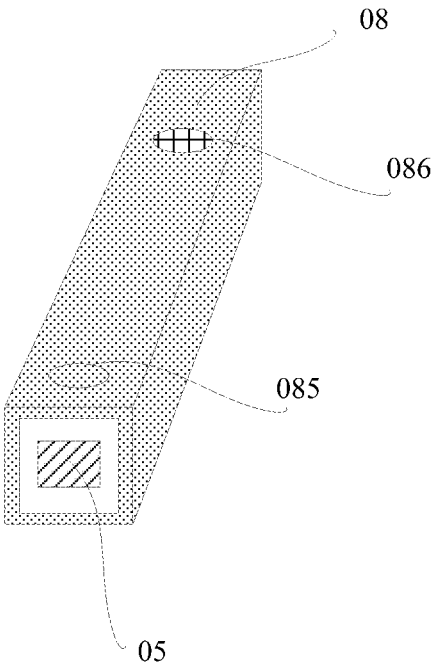

FIGS. 8-13 are schematic diagrams of fabricating the TFT according to another embodiment of the present disclosure;

FIG. 14 is a schematic plan view of a conventional display device;

FIG. 15 is a schematic plan view of a display device according to an embodiment of the present disclosure;

FIG. 16 is a three-dimensional schematic view of the TFT according to an embodiment of the present disclosure;

FIG. 17 is a schematic plan view of the display device according to another embodiment of the present disclosure;

FIG. 18 is a three-dimensional schematic view of the TFT according to another embodiment of the present disclosure;

FIG. 19 is a schematic plan view of the display device according to another embodiment of the present disclosure;

FIG. 20 is a three-dimensional schematic view of the TFT according to another embodiment of the present disclosure.

REFERENCE MARKERS

01 Substrate
02 Buffer layer
03 Second active layer
031 Second connection portion
04 Second gate insulating layer
05 Gate electrode
06 First gate insulating layer
07 Photoresist
08 First active layer
081 First connection portion
082, 085, 086 Conductive portion
083 First connection part
084 Second connection part
087 Arch upper surface
088 Arch side surface
09 Interlayer insulating layer
10 Via hole
101 First via hole
102 Second via hole
11 Active layer
12 Source-drain metal layer
121 Drain electrode
122 Source electrode
13 Data line
14 Gate line

DETAILED DESCRIPTION

In order to make the technical problems, technical solutions, and advantages to be solved by the embodiments of the present disclosure more apparent, a detailed description will be given below with reference to the accompanying drawings and specific embodiments.

A TFT, a preparation method therefor, and a display device are provided by the embodiments of the present disclosure, which can increase an on-state current of the TFT and reduce an area of the TFT.

The TFT is provided by the embodiments of the present disclosure, including a first active layer and a gate electrode arranged on a substrate extending along a first direction, the first active layer is an arch structure, the gate electrode is penetrated in the arch structure, and an orthographic projection of the first active layer on the substrate cover an orthographic projection of the gate electrode on the substrate.

In the present embodiment, a channel width of the TFT can be increased and a width-length ratio of the TFT channel can be increased by a structure of the three-dimensional channel surrounding the gate electrode, thereby increasing an on-state capability of the TFT; at the same time, control of a channel conduction capability of the gate electrode is strengthened by the structure of the three-dimensional channel surrounding the gate electrode, thereby effectively improving a driving capability and working stability of the TFT; in addition, the structure of the three-dimensional channel surrounding the gate electrode effectively reduces the area of the TFT, which is advantageous in improving an aperture ratio of the display device, satisfies the requirement of high resolution, and effectively solves a problem that an existing structure is difficult to improve the resolution by reducing the area of the TFT.

In a specific embodiment, as shown in FIGS. 1-5, the TFT of the embodiment includes a substrate 01, a buffer layer 02 arranged on the substrate 01, a gate electrode 05 located on the buffer layer 02, a first gate insulating layer 06 covering the gate electrode 05, and a first active layer 08 located on the first gate insulating layer 06, where the first active layer 08 is an arch structure, the gate electrode 05 is penetrating into the arch structure, and the first active layer 08 surrounds the gate electrode 05.

As shown in FIGS. 15 and 16, the gate electrode 05 extends in a first direction.

the first gate insulating layer 06 covers the gate electrode 05, and the first gate insulating layer 06 includes two first slots.

the first active layer 08 is located on A side of the first gate insulating layer 06 away from the gate electrode 05, extends along the first direction, and is filled in the two first slots to form two arch side surfaces 088 of the arch structure, the two arch side surfaces 088 surrounding the gate electrode 05.

The TFT further includes: an interlayer insulating layer 09 located on the side of the first active layer 08 away from the substrate 01, and a source electrode and a drain electrode located on the side of the interlayer insulating layer 09 away from the substrate 01, where the first active layer 08 is connected to the source electrode through a first via hole 101 penetrating the interlayer insulating layer, and is connected to the drain electrode through a second via hole 102 penetrating the interlayer insulating layer.

Where the annular arch structure of the first active layer 08 resembles an inverted U shape, and the U-shaped opening faces the substrate direction. The annular arch structure has three surfaces towards the substrate, an arch upper surface 087 at a top of the arch and two arch side surfaces 088 at two sides of the arch upper surface 087, the arch side surfaces 088 and the arch upper surface 087 form a three-sided non-closed annular shape, and the gate electrode 05 is surrounded by the three-sided non-closed annular shape.

In the embodiment, the TFT may further comprise:

a second active layer 03 located at a side of the gate electrode 05 away from the first active layer 08, the second active layer 03 is connected to two arch side surfaces to form a channel surrounding the gate electrode 05. In the present embodiment, the second active layer 03 can be connected to the first active layer 08 to form a closed ring-shaped surrounding gate electrode 05; a three-dimensional channel surrounding the gate electrode 05 is formed by the first active layer 08 and the second active layer 03. a channel width of the TFT can be increased and a width-length ratio of the TFT channel can be increased by a structure of the three-dimensional channel surrounding the gate electrode, thereby increasing an on-state capability of the TFT; at the same time, control of a channel conduction capability of the gate electrode is strengthened by the structure of the three-dimensional channel surrounding the gate electrode, thereby effectively improving a driving capability and working stability of the TFT; in addition, the structure of the three-dimensional channel surrounding the gate electrode effectively reduces the area of the TFT, which is advantageous in improving an aperture ratio of the display device, satisfies the requirement of high resolution, and effectively solves a problem that an existing structure is difficult to improve the resolution by reducing the area of the TFT. As shown in FIGS. 1-5, the TFT further includes: a second gate insulating layer 04 located between the gate electrode 05 and the second active layer 03, where the second gate insulating layer 04 includes two second slots, the first slot is in communication with the second slots, and the two arch side surfaces 088 are connected to the second active layer 03 via the second slots.

In the embodiment, in order to ensure a reliability of a connection between the second active layer 03 and the first active layer 08, the first active layer 08, in addition to including the arch structure, further includes a first connection portion 081 connected to the arch side surfaces 088, and the first connection portion 081 is located outside the arch structure and is parallel or substantially parallel to the substrate 01; the second active layer 03 includes a second connection portion 031 corresponding to the first connection portion 081, the second connection portion 031 is outside the arch structure and being parallel or substantially parallel to the substrate 01, the second connection portion 031 is in direct contact with the corresponding first connection portion 081, an orthographic projection of the second connection portion 031 on the substrate at least partially overlapping with an orthographic projection of the corresponding first connection portion 081 on the substrate.

In order to further improve the reliability of the connection between the second active layer 03 and the first active layer 08, the second connection portion 031 may be subjected to a conductive treatment; and/or, the first connection portion 081 may be subjected to a conductive treatment. Only the first connection portion 081 may be subjected to the conductive treatment, or only the second connection portion 031 may be subjected to the conductive treatment, or both the first connection portion 081 and the second connection portion 031 may be subjected to the conductive treatment. When the first connection portion 081 is subjected to the conductive treatment, some or all of the first connection portion 081 may be subjected to the conductive treatment; when the second connection portion 031 is subjected to the conductive treatment, part or all of the second connection portion 031 may be subjected to conducting treatment.

The technical solution of the present embodiment is further described below by a preparation process of the TFT of the present embodiment. The "patterning process" in the present embodiment includes a processes of depositing a film layer, coating a photoresist, mask exposure, developing, etching, and stripping the photoresist, and is a mature preparation process in the related art. The deposition may be performed by a known process such as sputtering, evaporation, or chemical vapor deposition, the coating may be performed by a known coating process, and the etching may be performed by a known method, which are not specifically limited herein. In the description of the present embodiment, it is to be understood that the term "thin film" refers to a thin film made by depositing or coating a material onto a substrate. A "thin film" may also be referred to as a "layer" if the "thin film" does not require a patterning or photolithographic process throughout the fabrication process. If the "thin film" also requires a patterning process or a photolithography process during the entire fabrication process, it is called "thin film" before the patterning process and "layer" after the patterning process. The "layer" after the patterning process or the photolithography process contains at least one "pattern".

A preparation method for the TFT of the embodiment, including:

forming a first active layer and a gate electrode extending along a first direction on a substrate, the first active layer is an arch structure, the gate electrode is penetrated in the arch structure, and an orthographic projection of the first active layer on the substrate cover an orthographic projection of the gate electrode on the substrate.

In some embodiments, the preparation method further includes:

forming a first gate insulating layer covering the gate electrode, where the first gate insulating layer includes two first slots;

the first active layer is located on a side of the first gate insulating layer away from the gate electrode, extends along the first direction, and is filled in the two first slots to form two arch side surfaces of the arch structure, the two arch side surfaces surrounding the gate electrode.

In some embodiments, the preparation method further includes:

forming a second active layer on a side of the gate electrode away from the first active layer, the second active layer is connected to the two arch side surfaces to form a channel surrounding the gate electrode.

Specifically, the preparation method for the present includes the following steps.

Figure 1:
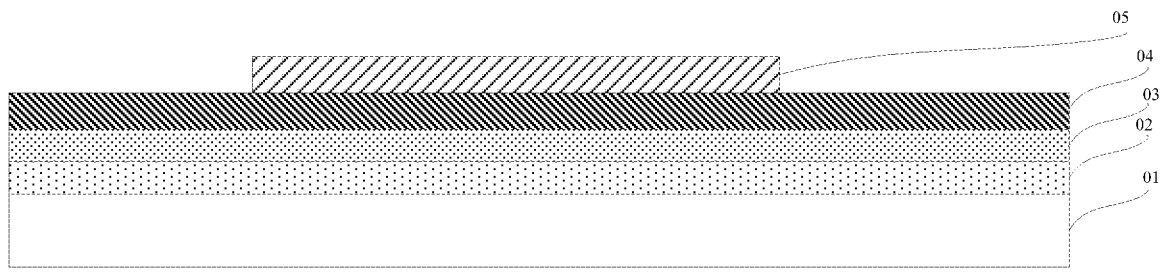
FIGS. 1-5 are schematic diagrams of fabricating a TFT according to an embodiment of the present disclosure.

As shown in FIG. 1, a buffer layer 02 and a second active layer 03 are formed on a substrate 01. The buffer layer 02 may be a silicon oxide SiOx, a silicon nitride SiNx, or a silicon oxynitride SiON, or may be a High k material, such as an aluminum oxide AlOx, a hafnium oxide HfOx, or a tantalum oxide TaOx, and may be a single layer, multiple layers, or a composite layer. The buffer layer 02 is mainly used for blocking diffusion of impurities contained in the substrate 01 into the second active layer 03 to prevent influence on characteristics of the TFT, such as threshold voltage and leakage current. An active layer film is formed on the buffer layer 02; a layer of photoresist is coated on the active layer thin film; the photoresist is exposed and developed using a one-tone mask plate; an unexposed region is formed at a position of the active layer pattern, and the photoresist remains; a fully exposed region is formed at other positions, and the photoresist is removed; and the active layer thin film at the fully exposed region is etched and the remaining photoresist is stripped to form a pattern of the second active layer 03. Various materials can be used for the second active layer 03, such as amorphous silicon a-Si, polycrystalline silicon p-Si, amorphous indium gallium zinc oxide material a-IGZO, zinc oxynitride ZnON, indium zinc tin oxide IZTO, or hexathiophene, polythiophene. Namely, the embodiments of the present disclosure are simultaneously applicable to a TFT manufactured based on amorphous silicon technology, polycrystalline silicon technology, oxide Oxide technology and organic technology, and can be an N-type TFT and can also be a P-type TFT. Preferably, the second active layer 03 of the embodiment uses polysilicon to form a low temperature Low Temperature Poly Silicon (LTPS) TFT.

As shown in FIG. 1, a second gate insulating layer 04 is formed, where the second gate insulating layer 04 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or a composite layer.

As shown in FIG. 1, a gate electrode 05 is formed, and forming the gate electrode 05 includes: forming a metal thin film, and patterning the metal thin film to form the gate electrode 05. The metal thin film may be made of a metal material, such as silver (Ag), copper (Cu), aluminum (Al), or molybdenum (Mo), or an alloy material of the above-mentioned metals, such as aluminum-neodymium alloy (AlNd), or molybdenum-niobium alloy (MoNb), may be a multilayer metal, such as Mo/Cu/Mo, or may be a stack structure formed of a metal and a transparent conductive material, such as ITO/Ag/ITO.

Figure 2:
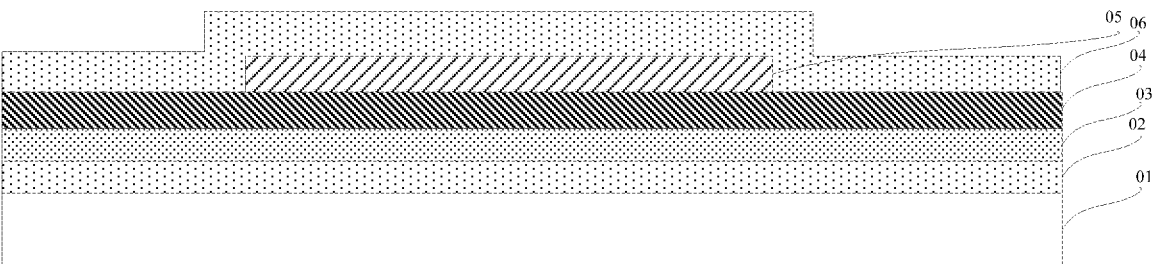

As shown in FIG. 2, a first gate insulating layer 06 is formed, where the first gate insulating layer 06 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or a composite layer. In order to achieve a uniform thickness of the first gate insulating layer 06, the first gate insulating layer 06 may be prepared using an atomic layer deposition ALD process.

Figure 3:
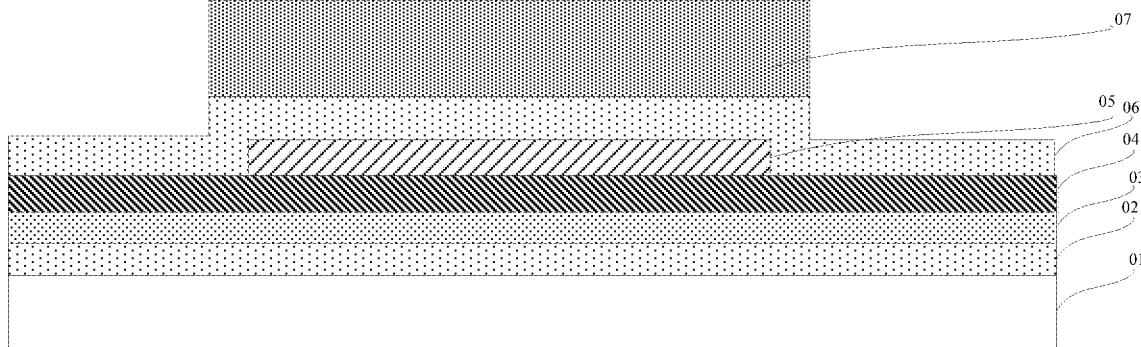

As shown in FIG. 3, a pattern of the photoresist 07 is formed.

Figure 4:
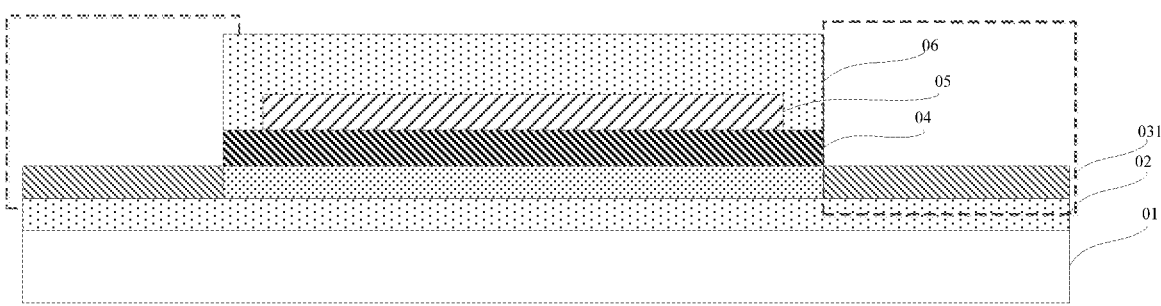

As shown in FIG. 4, the first gate insulating layer 06 is etched using the pattern of the photoresist 07 as a mask, so as to form a slot penetrating the first gate insulating layer 06, as shown in a rectangular dotted frame. The second active layer 03 is subjected to a conductive treatment through a slot penetrating the first gate insulating layer 06 to form a second connection portion 031 so as to improve the conductivity of the second connection portion 031. Specifically, the second active layer 03 can be subjected to the conductive treatment through a doping treatment, and the relevant doping and doping treatment processes are well known to those skilled in the art and will not be described in detail here. The pattern of the photoresist 07 is then removed.

Figure 5:
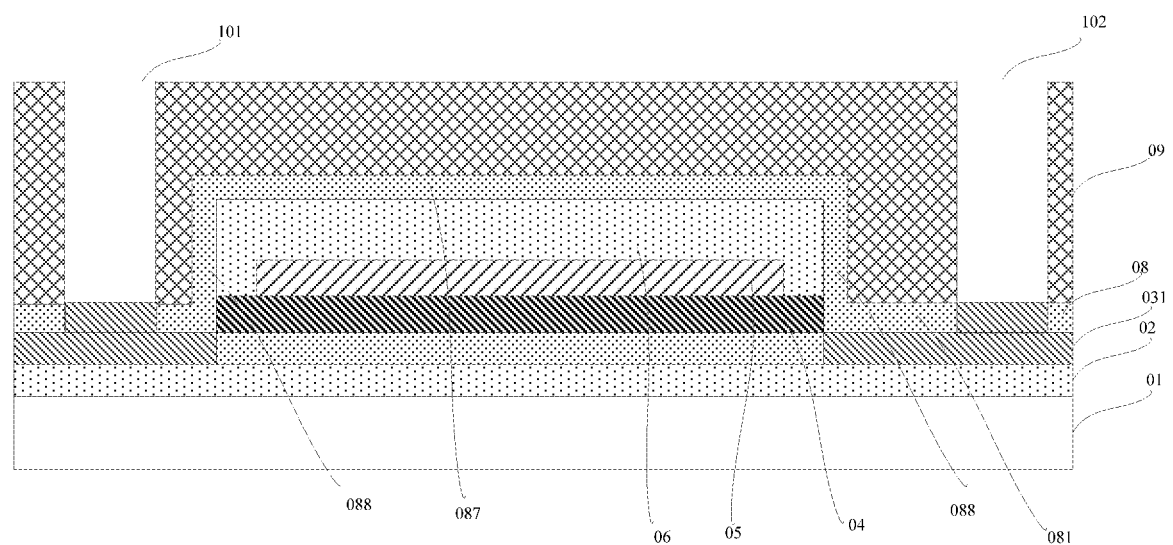

As shown in FIG. 5, a first active layer 08 is formed. Specifically, an active layer thin film is formed, a layer of photoresist is coated on the active layer thin film, the photoresist is exposed and developed using a one-tone mask plate, non-exposed areas are formed at the pattern positions of the active layer, the photoresist remains, completely exposed areas are formed at other positions, the photoresist is removed, and the active layer thin film at the completely exposed areas is etched and the remaining photoresist is stripped to form a pattern of the first active layer 08. Various materials can be used for the first active layer 08, such as amorphous silicon a-Si, polycrystalline silicon p-Si, amorphous indium gallium zinc oxide material a-IGZO, zinc oxynitride ZnON, indium zinc tin oxide IZTO, hexathiophene, or polythiophene. Namely, the embodiments of the present disclosure are simultaneously applicable to the TFT manufactured based on amorphous silicon technology, polycrystalline silicon technology, oxide Oxide technology and organic technology, and can be the N-type TFT and can also be the P-type TFT. Preferably, the first active layer 08 of the embodiment uses polysilicon to form the low temperature Low Temperature Poly Silicon (LTPS) TFT. The first active layer 08 is connected to the second active layer 03 through a slot penetrating the first gate insulating layer 06 and the second gate insulating layer 04, and the first active layer 08 and the second active layer 03 form an annular structure surrounding the gate electrode 05 to form a channel of a three-dimensional structure.

Forming an interlayer insulating layer 09. Where the interlayer insulating layer 09 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or composite layers. The interlayer insulating layer 09 includes a first via hole 101 and a second via hole 102; a source electrode can be connected to the first active layer 08 through the first via hole 101; and a drain electrode can be connected to the first active layer 08 through the second via hole 102. In order to improve the performance of the TFT, the second active layer 03 may be subjected to the doping treatment through the first via hole 101 and the second via hole 102, and the relevant doping and doping treatment processes are well known to a person skilled in the art and will not be described in detail herein.

Figure 6:
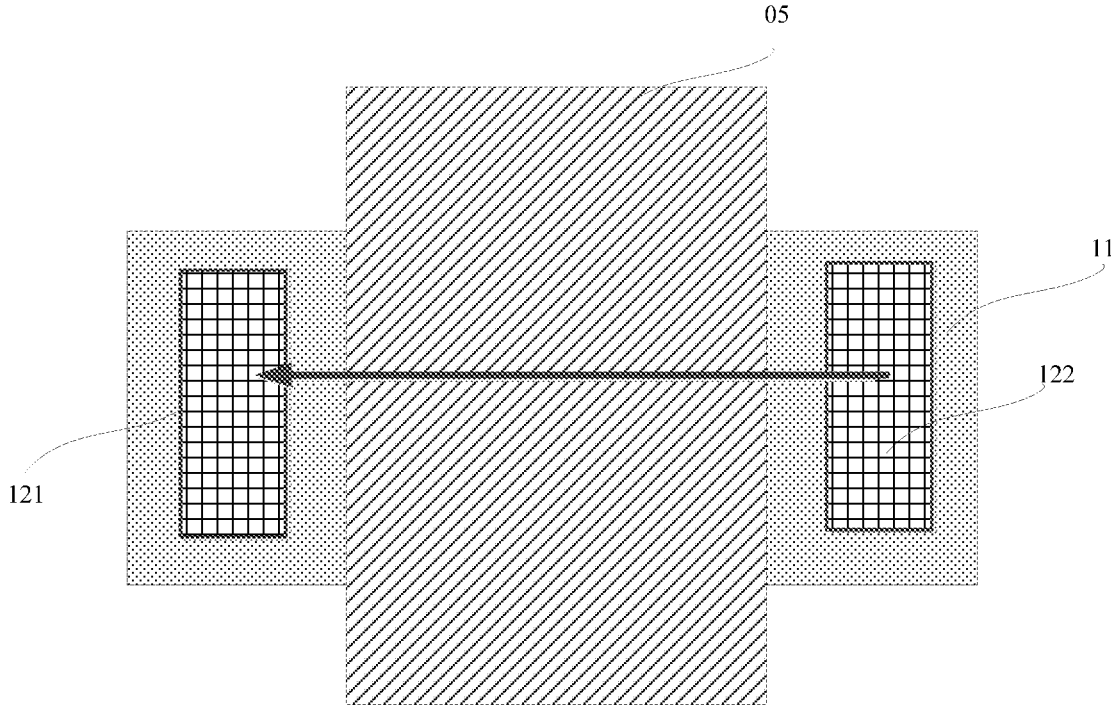
FIG. 6 is a schematic diagram of an on-state current direction of a conventional TFT.
Figure 7:
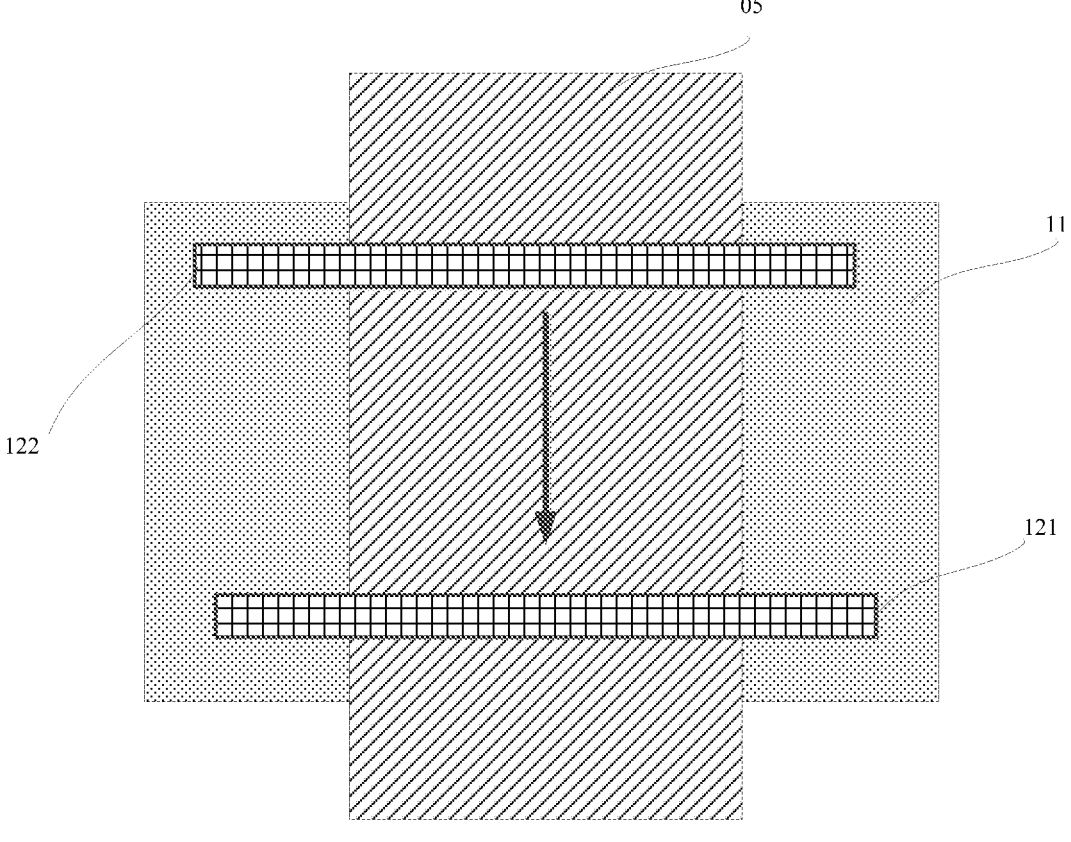
FIG. 7 is a schematic diagram of an on-state current direction of the TFT according to an embodiment of the present disclosure.

As can be seen from the structure and preparation process of the TFT according to the embodiments of the present disclosure, the present embodiment proposes a three-dimensional TFT, in which the width-to-length ratio of the channel of the TFT can be increased by a structure in which the gate electrode is surrounded by an annular active layer. FIG. 6 is a schematic diagram of an on-state current direction of a conventional TFT, where 11 is an active layer, 122 is a source electrode, 121 is a drain electrode and 05 is a gate electrode; FIG. 7 is an on-state current direction schematic diagram of the TFT according to an embodiment of the present disclosure, and after using the stereo channel of the present embodiment, the shortest distance between the drain electrode and the source electrode is the length of the channel of the TFT, unlike the conventional technology; the length (circumference) of the active layer 11 surrounding the gate electrode 05 is the channel width of the TFT, and thus the width-to-length ratio of the channel of the TFT can be increased.

The TFT, the gate electrode and the channel of the conventional quasi-planar structure are all horizontal structures; since the shorter the channel length is, the greater the leakage current is, and the more serious the short channel effect is, it is difficult to further reduce the channel length of the structure form, it is difficult to improve the width-to-length ratio of the channel of the TFT, and it is difficult to further reduce the area of the TFT. The embodiment of the present disclosure can ensure the performance of the TFT by increasing the width-to-length ratio of the channel of the TFT by actually forming a stereoscopic channel by the structure in which the gate electrode is surrounded by the annular channel. Further, even if the channel width to length ratio of the TFT of the present embodiment is the same as that of the conventional quasi-planar structure TFT, the area of the TFT of the present embodiment is much smaller than that of the conventional quasi-planar structure TFT. With the same channel length and channel width to length ratio, the projected area of the channel region of the TFT of the present embodiment can be reduced by 50%-60% compared with the projected area of the channel region of the TFT of the conventional quasi-planar structure, effectively reducing the area of the TFT.

In addition, in a case where the area of the TFT of the embodiment of the present disclosure is the same as that of the TFT of the conventional quasi-planar structure, since the embodiment of the present disclosure adopts the structure of a ring-shaped channel surrounding the gate electrode, it is possible to effectively increase the channel width to length ratio W/L, accelerate the channel opening speed, increase the electron mobility, reduce the threshold voltage drift, effectively improve the driving ability and operational stability of the TFT, and also to further reduce the leakage current and less power consumption by providing a stable negative pressure to accelerate the channel closing speed.

Furthermore, the embodiments of the present disclosure do not need to change the existing process flow, do not need to change the existing process equipment, have good compatibility with the existing process, high process realizability, strong practicality and a good application prospect.

In another specific embodiment, as shown in FIGS. 8-13, a TFT of the embodiment includes a substrate 01, a buffer layer 02 arranged on the substrate 01, a gate electrode 05 located on the buffer layer 02, a first gate insulating layer 06 covering the gate electrode 05, and a first active layer 08 located on the first gate insulating layer 06, where the first active layer 08 is an arch structure, the gate electrode 05 is penetrating into the arch structure, and the first active layer 08 surrounds the gate electrode 05.

Where the gate electrode 05 extends along a first direction;

the first gate insulating layer 06 covers the gate electrode 05, and the first gate insulating layer 06 includes two first slots;

the first active layer 08 is located on a side of the first gate insulating layer 06 away from the gate electrode 05, extends along the first direction, and is filled in the two first slots to form two arch side surfaces of the arch structure, the two arch side surfaces surrounding the gate electrode 05.

The TFT further includes: an interlayer insulating layer 09 located on the side of the first active layer 08 away from the substrate 01; a source drain metal layer 12 located on the side of the interlayer insulating layer 09 away from the substrate 01; the source drain metal layer 12 is connected to the first active layer 08 through a via hole 10 penetrating the interlayer insulating layer 09; and the source drain metal layer 12 includes a source electrode and/or a drain electrode.

Where the annular arch structure of the first active layer 08 resembles an inverted U shape, and the U-shaped opening faces the substrate direction. The annular arch structure has three surfaces towards the substrate direction, one arch upper surface located at a top of the arch and two arch side surfaces located at two sides of the arch upper surface, the arch side surfaces and the arch upper surface form a three-sided non-closed annular shape, and the gate electrode 05 is surrounded by the three-sided non-closed annular shape.

In the embodiment, the TFT may further include:

a second active layer 03 located at a side of the gate electrode 05 away from the first active layer 08, the second active layer 03 is connected to two arch side surfaces to form a channel surrounding the gate electrode 05. In the present embodiment, the second active layer 03 can be connected to the first active layer 08 to form a closed ring-shaped surrounding gate electrode 05; a three-dimensional channel surrounding the gate electrode 05 is formed by the first active layer 08 and the second active layer 03. a channel width of the TFT can be increased and a width-length ratio of the TFT channel can be increased by a structure of the three-dimensional channel surrounding the gate electrode, thereby increasing an on-state capability of the TFT; at the same time, control of a channel conduction capability of the gate electrode is strengthened by the structure of the three-dimensional channel surrounding the gate electrode, thereby effectively improving a driving capability and working stability of the TFT; in addition, the structure of the three-dimensional channel surrounding the gate electrode effectively reduces the area of the TFT, which is advantageous in improving an aperture ratio of the display device, satisfies the requirement of high resolution, and effectively solves a problem that an existing structure is difficult to improve the resolution by reducing the area of the TFT. As shown in FIGS. 8-13, the TFT further includes: a second gate insulating layer 04 located between the gate electrode 05 and the second active layer 03, where the second gate insulating layer 04 includes two second slots, the first slot is in communication with the second slots, and the two arch side surfaces are connected to the second active layer 03 via the second slots.

In order to improve the reliability of the electrical connection between the source drain metal layer 12 and the first active layer 08, the first active layer 08 may be conductively processed through the via hole 10 to form a conductive portion 082.

The technical solution of the present embodiment is further described below by the preparation process of the TFT of the present embodiment. A preparation method for the TFT of the embodiment, including:

forming a first active layer and a gate electrode extending along a first direction on a substrate, the first active layer is an arch structure, the gate electrode is penetrated the arch structure, and an orthographic projection of the first active layer on the substrate cover an orthographic projection of the gate electrode on the substrate.

In some embodiments, the preparation method further includes:

forming a first gate insulating layer covering the gate electrode, where the first gate insulating layer includes two first slots;

the first active layer is located on a side of the first gate insulating layer away from the gate electrode, extends along the first direction, and is filled in the two first slots to form two arch side surfaces of the arch structure, the two arch side surfaces surrounding the gate electrode.

In some embodiments, the preparation method further includes:

forming a second active layer on a side of the gate electrode away from the first active layer, the second active layer is connected to the two arch side surfaces to form a channel surrounding the gate electrode.

Specifically, the preparation method for the TFT of the present embodiment includes the following steps.

Figure 8:
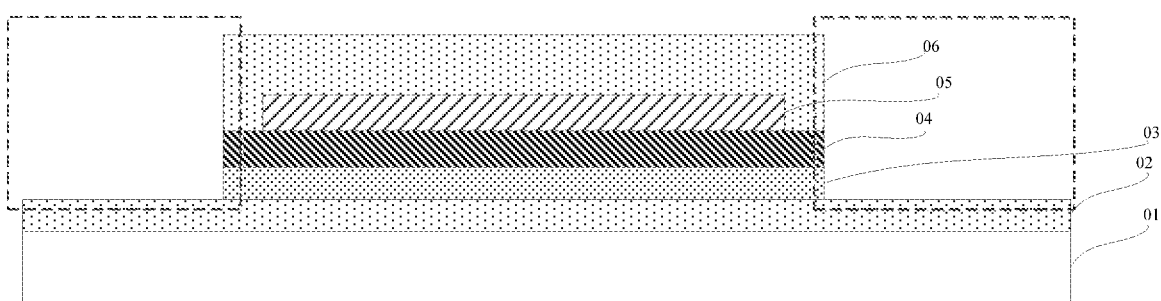

As shown in FIG. 8, a buffer layer 02 and a second active layer 03 are formed on a substrate 01. The buffer layer 02 may be a silicon oxide SiOx, a silicon nitride SiNx, or a silicon oxynitride SiON, or may be a High k material, such as an aluminum oxide AlOx, a hafnium oxide HfOx, or a tantalum oxide TaOx, and may be a single layer, multiple layers, or a composite layer. The buffer layer 02 is mainly used for blocking diffusion of impurities contained in the substrate 01 into the second active layer 03 to prevent influence on characteristics of the TFT, such as threshold voltage and leakage current. An active layer film is formed on the buffer layer 02; a layer of photoresist is coated on the active layer thin film; the photoresist is exposed and developed using a one-tone mask plate; an unexposed region is formed at the position of the active layer pattern, and the photoresist remains; a fully exposed region is formed at other positions, and the photoresist is removed; and the active layer thin film at the fully exposed region is etched and the remaining photoresist is stripped to form a pattern of the second active layer 03. Various materials can be used for the second active layer 03, such as amorphous silicon a-Si, polycrystalline silicon p-Si, amorphous indium gallium zinc oxide material a-IGZO, zinc oxynitride ZnON, indium zinc tin oxide IZTO, hexathiophene, or polythiophene, namely, the embodiments of the present disclosure are simultaneously applicable to a TFT manufactured based on amorphous silicon technology, polycrystalline silicon technology, oxide Oxide technology and organic technology, and can be an N-type TFT and can also be a P-type TFT. Preferably, the second active layer 03 of the embodiment uses polysilicon to form a low temperature Low Temperature Poly Silicon (LTPS) TFT.

As shown in FIG. 8, a second gate insulating layer 04 is formed, wherein the second gate insulating layer 04 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or a composite layer.

As shown in FIG. 8, a gate electrode 05 is formed, and forming the gate electrode 05 includes: forming a metal thin film, and patterning the metal thin film to form a gate electrode 05. The metal thin film may be made of a metal material, such as silver (Ag), copper (Cu), aluminum (Al), or molybdenum (Mo), or an alloy material of the above-mentioned metals, such as aluminum-neodymium alloy (AlNd), or molybdenum-niobium alloy (MoNb), and may be a multilayer metal, such as Mo/Cu/Mo, or may be a stack structure formed of a metal and a transparent conductive material, such as ITO/Ag/ITO.

As shown in FIG. 8, a first gate insulating layer 06 is formed, where the first gate insulating layer 06 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or a composite layer. In order to achieve a uniform thickness of the first gate insulating layer 06, the first gate insulating layer 06 may be prepared using an atomic layer deposition ALD process. The grooves of the first gate insulating layer 06 penetrate the grooves of the second gate insulating layer 04 to form a groove structure shown in a dotted line frame.

Figure 9:
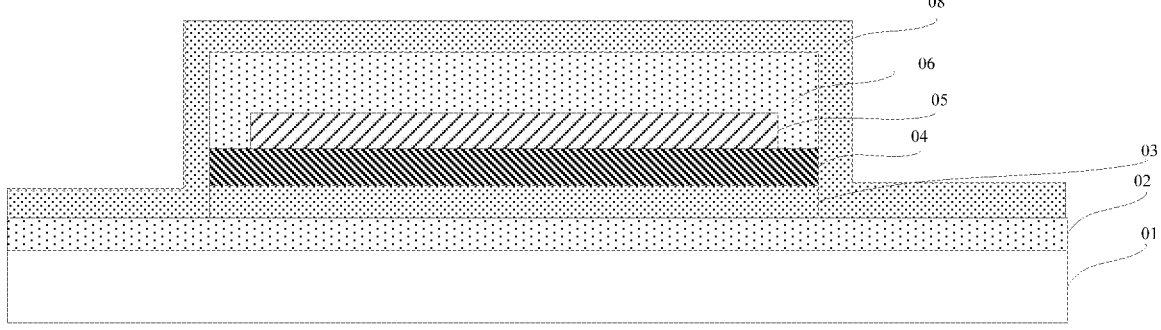

As shown in FIG. 9, a first active layer 08 is formed. Specifically, an active layer thin film is formed, a layer of photoresist is coated on the active layer thin film, the photoresist is exposed and developed using a one-tone mask plate, non-exposed areas are formed at the pattern positions of the active layer, the photoresist remains, completely exposed areas are formed at other positions, the photoresist is removed, and the active layer thin film at the completely exposed areas is etched and the remaining photoresist is stripped to form a pattern of the first active layer 08. Various materials can be used for the first active layer 08, such as amorphous silicon a-Si, polycrystalline silicon p-Si, amorphous indium gallium zinc oxide material a-IGZO, zinc oxynitride ZnON, indium zinc tin oxide IZTO, hexathiophene, or polythiophene, namely, the embodiments of the present disclosure are simultaneously applicable to the TFT manufactured based on amorphous silicon technology, polycrystalline silicon technology, oxide Oxide technology and organic technology, and can be the N-type TFT and can also be the P-type TFT. Preferably, the first active layer 08 of the embodiment uses polysilicon to form the low temperature Low Temperature Poly Silicon (LTPS) TFT. The first active layer 08 is connected to the second active layer 03 through a slot penetrating the first gate insulating layer 06 and the second gate insulating layer 04, and the first active layer 08 and the second active layer 03 form an annular structure surrounding the gate electrode 05 to form a channel of a three-dimensional structure.

Figure 10:
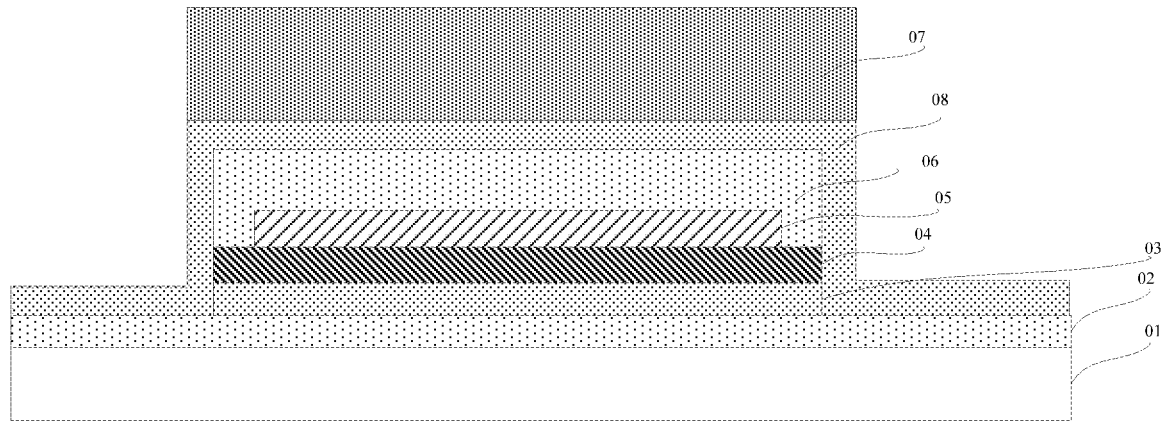

As shown in FIG. 10, a pattern of the photoresist 07 is formed.

Figure 11:
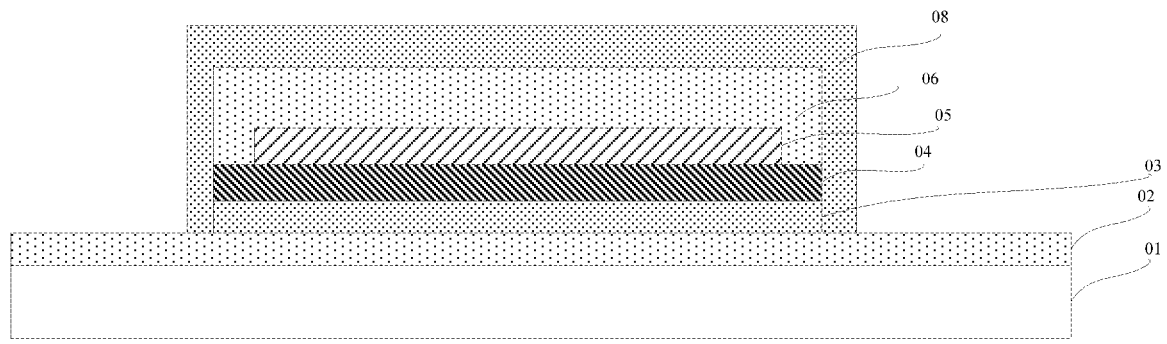

As shown in FIG. 11, the first active layer 08 is etched using the pattern of the photoresist 07 as a mask to remove the portion of the first active layer 08 outside the arch structure.

Figure 12:
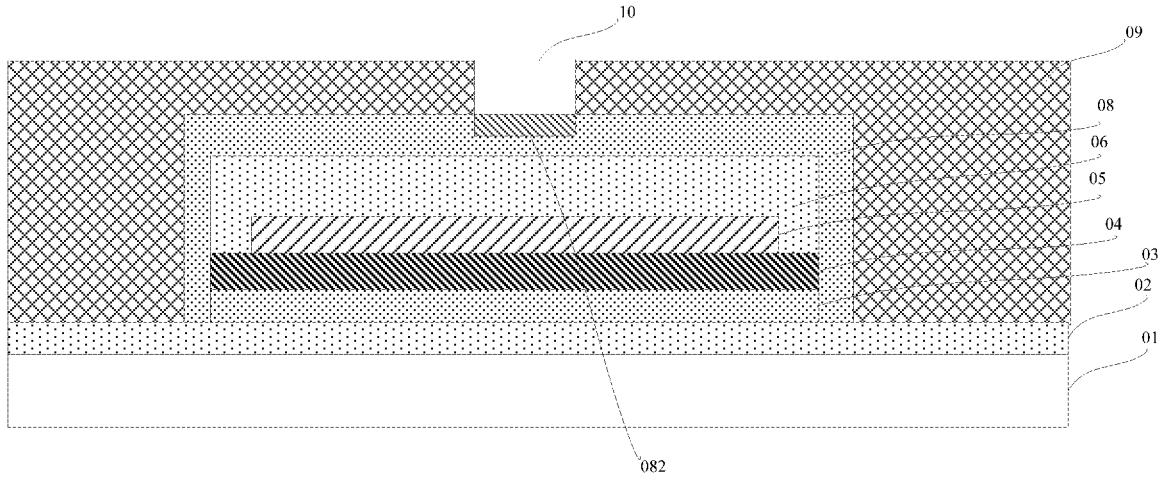

As shown in FIG. 12, an interlayer insulating layer 09 is formed, where the interlayer insulating layer 09 can use a silicon oxide SiOx, a silicon nitride SiNx, or a silicon oxynitride SiON, or can also use a High k material, such as an aluminium oxide AlOx, a hafnium oxide HfOx, or a tantalum oxide TaOx, and can be a single layer, multiple layers or composite layers. The interlayer insulating layer 09 includes a via hole 10, and a source electrode and/or a drain electrode can be connected to the first active layer 08 through the via hole 10. To improve the performance of the TFT, the first active layer 08 may be doped through the via hole 10 to form a conductive portion 082. The doping and doping processes are well known to those skilled in the art and will not be described in detail herein.

Figure 13:
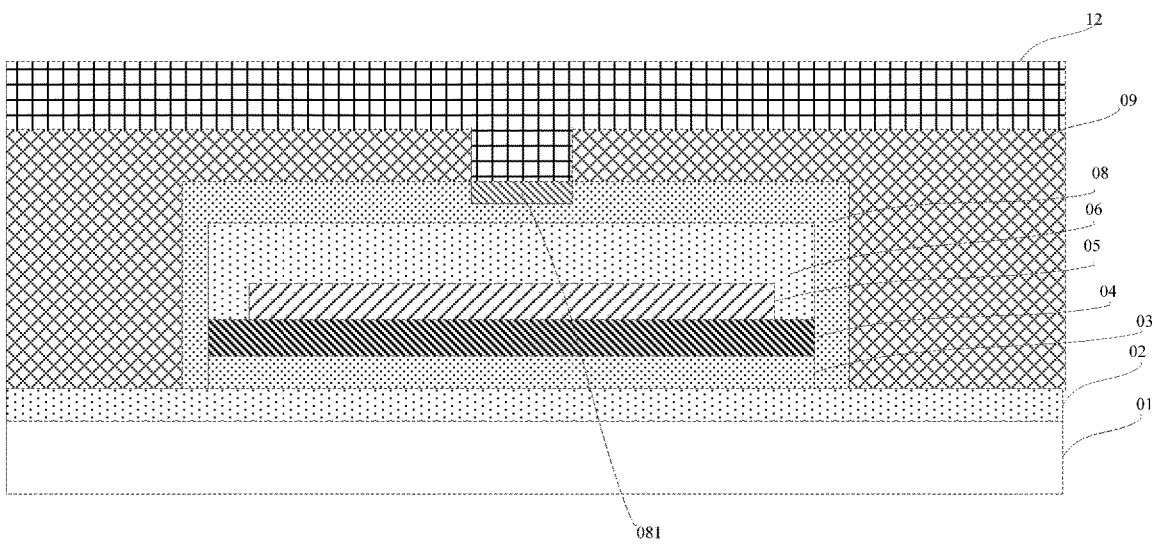

As shown in FIG. 13, forming a pattern of a source drain metal layer 12. The forming the source drain metal layer 12 including: forming a metal thin film, and patterning the metal thin film to form a pattern of a source drain metal layer 12, including a source electrode and a drain electrode. The metal thin film may be made of a metal material, such as silver (Ag), copper (Cu), aluminum(Al), or molybdenum (Mo), or an alloy material of the above-mentioned metals, such as aluminum-neodymium alloy (AlNd), or molybdenum-niobium alloy (MoNb), and may be a multilayer metal, such as Mo/Cu/Mo, or may be a stack structure formed of a metal and a transparent conductive material, such as ITO/Ag/ITO.

As can be seen from the structure and preparation process of the TFT according to the embodiments of the present disclosure, the present embodiment proposes a three-dimensional TFT, in which the width-to-length ratio of the channel of the TFT can be increased by a structure in which the gate electrode is surrounded by an annular active layer. FIG. 6 is an on-state current direction schematic diagram of a conventional TFT, wherein 11 is an active layer, 122 is a source electrode, and 121 is a drain electrode; FIG. 7 is an on-state current direction schematic diagram of a TFT according to an embodiment of the present disclosure, and after using the stereo channel of the present embodiment, the shortest distance between the drain electrode and the source electrode is the length of the channel of the TFT, unlike the conventional technology; the length (circumference) of the active layer 11 surrounding the gate electrode 05 is the channel width of the TFT, and thus the width-to-length ratio of the channel of the TFT can be increased.

The TFT, the gate electrode and the channel of the conventional quasi-planar structure are all horizontal structures; since the shorter the channel length is, the greater the leakage current is, and the more serious the short channel effect is, it is difficult to further reduce the channel length of the structure form, it is difficult to improve the width-to-length ratio of the channel of the TFT, and it is difficult to further reduce the area of the TFT. The embodiment of the present disclosure can ensure the performance of the TFT by increasing the width-to-length ratio of the channel of the TFT by actually forming a stereoscopic channel by the structure in which the gate electrode is surrounded by the annular channel. Further, even if the channel width to length ratio of the TFT of the present embodiment is the same as that of the conventional quasi-planar structure TFT, the area of the TFT of the present embodiment is much smaller than that of the conventional quasi-planar structure TFT. With the same channel length and channel width to length ratio, the projected area of the channel region of the TFT of the present embodiment can be reduced by 50%-60% compared with the projected area of the channel region of the TFT of the conventional quasi-planar structure, effectively reducing the area of the TFT.

In addition, in a case where the area of the TFT of the embodiment of the present disclosure is the same as that of the TFT of the conventional quasi-planar structure, since the embodiment of the present disclosure adopts a structure in which a ring-shaped channel surrounds a gate electrode, it is possible to effectively increase the channel width to length ratio W/L, accelerate the channel opening speed, increase the electron mobility, reduce the threshold voltage drift, effectively improve the driving ability and operational stability of the TFT, and also to further reduce the leakage current and less power consumption by providing a stable negative pressure to accelerate the channel closing speed.

Furthermore, the embodiments of the present disclosure do not need to change the existing process flow, do not need to change the existing process equipment, have good compatibility with the existing process, high process realizability, strong practicality and a good application prospect.

A display device is further provided in the embodiments of the present disclosure, including the TFT as described above.

FIG. 14 is a schematic plan view of a conventional display device, where 13 is a data line, 14 is a gate line, and the oval solid frame is a TFT. It can be seen that the conventional TFT has a relatively large area, resulting in a relatively small opening area of the display device (shown in the dashed frame), resulting in a relatively small aperture ratio of the display device.

FIG. 15 is a schematic plan view of a display device according to a specific embodiment of the present disclosure, and FIG. 16 is a schematic perspective view of a TFT in the embodiment. In the display device, a gate electrode 05 and a gate line 14 are in an integrated structure, and the TFT further includes: a first connection part 083 and a second connection part 084 extending from the first active layer 08; where an extension direction of the first connection part 083 is a second direction, the second direction is parallel or substantially parallel to the substrate and perpendicular to the first direction, and the first active layer 08 can be connected to the source electrode via the first connection part 083; the extension direction of the second connection part 084 is the second direction, and the first active layer 08 can be connected to the drain electrode via the second connection part 084.

Here, only the first connection part 083 may extend from the first active layer 08, or only the second connection part 084 may extend from the first active layer 08, or both the first connection part 083 and the second connection part 084 may extend from the first active layer 08. An interlayer insulating layer is spaced between the first connection part 083 and/or the second connection part 084 and the source drain metal layer, and the first connection part 083 and/or the second connection part 084 can be connected to a source electrode and/or a drain electrode formed by the source drain metal layer through a via penetrating the interlayer insulating layer.

It can be seen that the present embodiment can reduce the area of the TFT and increase an area of an opening region (shown in a dotted frame) of the display device by using the channel having the three-dimensional structure, thereby increasing an opening ratio of the display device.

FIG. 17 is a schematic plan view of a display device according to another specific embodiment of the present disclosure, and FIG. 18 is a three-dimensional schematic view of the TFT in the embodiment. In the display device, the gate electrode 05 and the gate line 14 are in an integrated structure, and the TFT further includes: a first connection part 083 extending from the first active layer 08; where the extension direction of the first connection part 083 is the second direction, the second direction is parallel or substantially parallel to the substrate and perpendicular to the first direction, and the first active layer 08 can be connected to the source electrode via the first connection part 083; the first active layer 08 further includes a conductive portion 085, where the conductive portion 085 is a part where the orthographic projection of the first via hole 101 on the first active layer 08 is located; in the embodiment, the orthographic projection of the first via hole on the substrate falls within the orthographic projection of the gate line on the substrate, that is to say, the orthographic projection of the conductive portion 085 on the substrate falls within the orthographic projection of the gate line 14 on the substrate, so that the area of the TFT can be further reduced, and the area of the opening area (shown in a dotted line frame) of the display device can be increased, thereby increasing the aperture ratio of the display device.

FIG. 19 is a schematic plan view of a display device according to another specific embodiment of the present disclosure, and FIG. 18 is the three-dimensional schematic view of the TFT in the embodiment. In the display device, the gate electrode 05 and the gate line 14 are in the integrated structure, and the first active layer 08 further includes conductive portions 085 and 086, where the conductive portion 085 is an orthographic projection of a first via hole 101 on the first active layer 08, and the conductive portion 086 is an orthographic projection of a second via hole 102 on the first active layer 08. In the embodiment, the orthographic projection of the first via hole on the substrate falls within the orthographic projection of the gate line on the substrate, namely, the orthographic projection of the conductive portion 085 on the substrate falls within the orthographic projection of the gate line on the substrate, and the orthographic projection of the second via hole on the substrate falls within the orthographic projection of the gate line on the substrate, namely, the orthographic projection of the conductive portion 086 on the substrate falls within the orthographic projection of the gate line on the substrate, so that the area of the TFT can be further reduced and the area of the opening area (shown in the dotted line frame) of the display device can be increased. Further, the aperture ratio of the display device is increased.

The display device of the present embodiment includes, but is not limited to: a radio frequency unit, a network module, an audio output unit, an input unit, a sensor, a display unit, a user input unit, an interface unit, a memory, a processor, and a power supply. It will be appreciated by those skilled in the art that the configuration of the display device described above is not intended to be limiting and that the display device may comprise more or fewer of the components described above, or some combinations of the components, or different arrangements of the components. In embodiments of the present disclosure, display devices comprise, but are not limited to, displays, cell phones, tablets, televisions, wearable electronics, navigation display devices.

The display device may be: any product or component with a display function, such as a television, a display, a digital photo frame, a mobile phone, a tablet computer, where the display device further includes a flexible circuit board, a printed circuit board and a back panel.

It should be noted that the various embodiments described herein are described in a progressive manner with reference to the same or similar parts throughout the various embodiments, with each embodiment focusing on differences from the other embodiments. In particular, the embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The use of "first", "second", and the like in this disclosure does not denote any order, quantity, or importance, but rather is used to distinguish one element from another. The word "including" or "includes", and the like, means that the presence of an element or item preceding the word covers the presence of the element or item listed after the word and equivalents thereof, but does not exclude other elements or items. "Connected" or "connected" and the like are not limited to physical or mechanical connections, but may comprise electrical connections, whether direct or indirect. The terms "upper", "lower", "left", "right" and the like are used only to indicate relative positional relationships that may change accordingly when the absolute position of the object being described changes.

It will be understood that when an element such as a layer, film, region or substrate is referred to as being "on" or "under" another element, it can be "directly on" or "directly under" the other element or intervening elements may be present.

In the description of the embodiments above, particular features, structures, materials, or characteristics may be combined in any suitable manner in any one or more embodiments or examples.

The above is only a specific implementation of the present disclosure, but the scope of protection of the present disclosure is not limited thereto. Any changes or substitutions that can be easily conceived by those skilled in the art within the technical scope of the present disclosure should fall within the protection scope of the present disclosure. Accordingly, the protection scope of the present disclosure should be determined by the protection scope of the claims.

What is claimed is:

1. A thin film transistor (TFT), comprising a first active layer and a gate electrode arranged on a substrate extending along a first direction, the first active layer is an arch structure, the gate electrode is disposed through the arch structure, and an orthographic projection of the first active layer on the substrate covers an orthographic projection of the gate electrode on the substrate;

wherein the TFT further comprises a first gate insulating layer, the first gate insulating layer covers the gate electrode, and the first gate insulating layer comprises two first slots;

the first active layer is located on a side of the first gate insulating layer away from the gate electrode, and is filled in the two first slots to form two arch side surfaces of the arch structure, the two arch side surfaces surrounding the gate electrode.

2. The TFT according to claim 1, wherein the TFT further comprises:
a source electrode and a drain electrode, located on a side of the first active layer away from the substrate, and connected to the first active layer, respectively.

3. The TFT according to claim 2, wherein the TFT further comprises:
a first connection part and/or a second connection part extending from the first active layer; wherein
an extension direction of the first connection part is a second direction, the second direction is parallel or substantially parallel to the substrate and perpendicular to the first direction, and the first active layer is connected to the source electrode via the first connection part; and
an extension direction of the second connection part is the second direction, and the first active layer is connected to the drain electrode via the second connection part.

4. The TFT according to claim 2, wherein the TFT further comprises:
an interlayer insulating layer, located between the first active layer and the source electrode and drain electrode, wherein the first active layer is connected to the source electrode through a first via hole penetrating the interlayer insulating layer, and is connected to the drain electrode through a second via hole penetrating the interlayer insulating layer.

5. The TFT according to claim 1, wherein the TFT further comprises:
a second active layer located at a side of the gate electrode away from the first active layer, the second active layer is connected to the two arch side surfaces to form a channel surrounding the gate electrode.

6. The TFT according to claim 5, wherein the TFT further comprises:
a second gate insulating layer located between the gate electrode and the second active layer, wherein the second gate insulating layer comprises two second slots, the first slots are in communication with the second slots, and the two arch side surfaces are connected to the second active layer via the second slots.

7. The TFT according to claim 5, wherein the first active layer further comprises a first connection portion connected to the arch side surfaces, the first connection portion is located outside the arch structure and parallel or substantially parallel to the substrate;
the second active layer comprises a second connection portion corresponding to the first connection portion, the second connection portion is located outside the arch structure and parallel or substantially parallel to the substrate, the second connection portion is in direct contact with the corresponding first connection portion, an orthographic projection of the second connection portion on the substrate at least partially covers an orthographic projection of the corresponding first connection portion on the substrate.

8. The TFT according to claim 7, wherein the second connection portion is subjected to a conductive treatment; and/or
the first connection portion is subjected to the conductive treatment.

9. A display device, comprising a thin film transistor (TFT), the TFT comprises a first active layer and a gate electrode arranged on a substrate extending along a first direction, the first active layer is an arch structure, the gate electrode is disposed through the arch structure, and an orthographic projection of the first active layer on the substrate covers an orthographic projection of the gate electrode on the substrate;
wherein the TFT further comprises a first gate insulating layer,
the first gate insulating layer covers the gate electrode, and the first gate insulating layer comprises two first slots;
the first active layer is located on a side of the first gate insulating layer away from the gate electrode, and is filled in the two first slots to form two arch side surfaces of the arch structure, the two arch side surfaces surrounding the gate electrode.

10. The display device according to claim 9, wherein the gate electrode is of an integral structure with a gate line of the display device.

11. The display device according to claim 10, wherein the TFT further comprises:
a source electrode and a drain electrode, located on a side of the first active layer away from the substrate, and connected to the first active layer, respectively;
an interlayer insulating layer, located between the first active layer and the source electrode and drain electrode, wherein the first active layer is connected to the source electrode through a first via hole penetrating the interlayer insulating layer, and is connected to the drain electrode through a second via hole penetrating the interlayer insulating layer;
wherein an orthographic projection of the first via hole on the substrate falls within an orthographic projection of the gate line on the substrate; and/or
an orthographic projection of the second via hole on the substrate falls within an orthographic projection of the gate line on the substrate.

12. The display device according to claim 11, wherein the TFT further comprises:
a first connection part and/or a second connection part extending from the first active layer; wherein
an extension direction of the first connection part is a second direction, the second direction is parallel or substantially parallel to the substrate and perpendicular to the first direction, and the first active layer is connected to the source electrode via the first connection part; and
an extension direction of the second connection part is the second direction, and the first active layer is connected to the drain electrode via the second connection part.

13. The display device according to claim 11, wherein the TFT further comprises:
a second active layer located at a side of the gate electrode away from the first active layer, the second active layer is connected to the two arch side surfaces to form a channel surrounding the gate electrode.

14. The display device according to claim 13, wherein the TFT further comprises:
a second gate insulating layer located between the gate electrode and the second active layer, wherein the second gate insulating layer comprises two second slots, the first slots are in communication with the second slots, and the two arch side surfaces are connected to the second active layer via the second slots.

15. The display device according to claim 13, wherein the first active layer further comprises a first connection portion connected to the arch side surfaces, the first connection portion is located outside the arch structure and parallel or substantially parallel to the substrate;

the second active layer comprises a second connection portion corresponding to the first connection portion, the second connection portion is located outside the arch structure and parallel or substantially parallel to the substrate, the second connection portion is in direct contact with the corresponding first connection portion, an orthographic projection of the second connection portion on the substrate at least partially covers an orthographic projection of the corresponding first connection portion on the substrate.

16. The display device according to claim 15, wherein the second connection portion is subjected to a conductive treatment; and/or the first connection portion is subjected to the conductive treatment.

17. A preparation method for a thin film transistor (TFT), comprising:

forming a first active layer and a gate electrode extending along a first direction on a substrate, the first active layer is an arch structure, the gate electrode is penetrated in the arch structure, and an orthographic projection of the first active layer on the substrate covers an orthographic projection of the gate electrode on the substrate;

wherein the preparation method further comprises:

forming a first gate insulating layer covering the gate electrode, wherein the first gate insulating layer comprises two first slots;

the first active layer is located on a side of the first gate insulating layer away from the gate electrode, extends along the first direction, and is filled in the two first slots to form two arch side surfaces of the arch structure, the two arch side surfaces surrounding the gate electrode.

18. The preparation method for a TFT according to claim 17, wherein the preparation method further comprises:

forming a second active layer on a side of the gate electrode away from the first active layer, the second active layer is connected to the two arch side surfaces to form a channel surrounding the gate electrode.

\* \* \* \* \*